(12) United States Patent
Katayama et al.

(10) Patent No.: US 12,470,867 B2
(45) Date of Patent: Nov. 11, 2025

(54) SEMICONDUCTOR DEVICE AND ELECTRONIC APPARATUS

(71) Applicant: SEIKO EPSON CORPORATION, Tokyo (JP)

(72) Inventors: Takao Katayama, Matsumoto (JP); Burton Alexander, Richmond (CA); Fumihito Baisho, Kai (JP); Tsutomu Nonaka, Hino (JP)

(73) Assignee: SEIKO EPSON CORPORATION (JP)

( * ) Notice: Subject to any disclaimer, the term of this patent is extended or adjusted under 35 U.S.C. 154(b) by 215 days.

(21) Appl. No.: 18/361,171

(22) Filed: Jul. 28, 2023

(65) Prior Publication Data

US 2024/0040308 A1 Feb. 1, 2024

(30) Foreign Application Priority Data

Jul. 29, 2022 (JP) ................. 2022-121540

(51) Int. Cl.
*H04R 3/00* (2006.01)
*H04R 29/00* (2006.01)

(52) U.S. Cl.
CPC ........... *H04R 3/007* (2013.01); *H04R 29/001* (2013.01); *H04R 29/008* (2013.01)

(58) Field of Classification Search
CPC ...... H04R 3/00; H04R 19/02; H04R 2420/07; H04R 3/04; H04R 19/005; H04R 2201/003; H04R 3/02; H04R 3/007; H04R 2430/01; H04R 2201/028; H04R 29/001; H04R 29/008; G10L 25/51; H03K 7/08; H03M 3/39

See application file for complete search history.

(56) References Cited

U.S. PATENT DOCUMENTS

| 10,469,042 | B1* | 11/2019 | Karsten | H03F 3/2173 |
| 2012/0025910 | A1* | 2/2012 | Jiang | H03F 3/217 330/251 |
| 2015/0347424 | A1* | 12/2015 | Herbst | G10L 19/00 700/94 |
| 2020/0081684 | A1* | 3/2020 | Akahori | H04R 3/04 |
| 2021/0127206 | A1* | 4/2021 | Katayama | G06F 3/16 |

FOREIGN PATENT DOCUMENTS

JP 2020-041953 A 3/2020

\* cited by examiner

*Primary Examiner* — Akelaw Teshale
(74) *Attorney, Agent, or Firm* — Harness, Dickey & Pierce, P.L.C.

(57) ABSTRACT

Provided is a semiconductor device including: a pulse-width modulation circuit configured to pulse-width modulate a signal based on a first pulse-code modulated signal that is a sound source signal, and output a first pulse-width modulated signal; a first conversion circuit configured to convert a second pulse-width modulated signal based on the first pulse-width modulated signal into a second pulse-code modulated signal; and a comparison circuit configured to convert the first pulse-code modulated signal into a first comparison target signal by an inversely convertible conversion method, convert the second pulse-code modulated signal into a second comparison target signal by the conversion method, and compare the first comparison target signal with the second comparison target signal.

7 Claims, 12 Drawing Sheets

SEMICONDUCTOR DEVICE AND ELECTRONIC APPARATUS

The present application is based on, and claims priority from JP Application Serial Number 2022-121540, filed Jul. 29, 2022, the disclosure of which is hereby incorporated by reference herein in its entirety.

BACKGROUND

1. Technical Field

The present disclosure relates to a semiconductor device and an electronic apparatus.

2. Related Art

JP-A-2020-41953 discloses a sound output device including: a sound source reproduction unit that reproduces a sound source to output a reproduction signal; an amplification unit that amplifies the reproduction signal and outputs the amplified reproduction signal to a speaker; and a failure detection unit that detects a failure in the amplification unit, in which the failure detection unit compares a converted reproduction signal obtained by converting the reproduction signal into a binary value or a ternary value with a converted output signal obtained by converting an output signal into a binary value or a ternary value, and determines the failure in the amplification unit based on a comparison result.

In the sound output device disclosed in JP-A-2020-41953, since the converted reproduction signal and the converted output signal are the binary values or the ternary values and some information on the reproduction signal and the output signal is lost, accuracy of failure determination may decrease.

SUMMARY

A semiconductor device according to an aspect of the present disclosure includes:
- a pulse-width modulation circuit configured to pulse-width modulate a signal based on a first pulse-code modulated signal that is a sound source signal, and output a first pulse-width modulated signal;
- a first conversion circuit configured to convert a second pulse-width modulated signal based on the first pulse-width modulated signal into a second pulse-code modulated signal; and
- a comparison circuit configured to convert the first pulse-code modulated signal into a first comparison target signal by an inversely convertible conversion method, convert the second pulse-code modulated signal into a second comparison target signal by the conversion method, and compare the first comparison target signal with the second comparison target signal.

An electronic apparatus according to an aspect of the present disclosure includes:
- the semiconductor device according to the aspect; and
- a sound reproduction device, in which
- the semiconductor device includes an amplifier circuit configured to output an amplified signal obtained by amplifying the first pulse-width modulated signal to the sound reproduction device.

DESCRIPTION OF EMBODIMENTS

Hereinafter, preferred embodiments of the present disclosure will be described in detail with reference to the drawings. The embodiments described below do not unduly limit content of the present disclosure disclosed in the claims. Further, not all configurations described below are essential constituent elements of the present disclosure.

1. Semiconductor Device

1-1. First Embodiment

Figure 1:
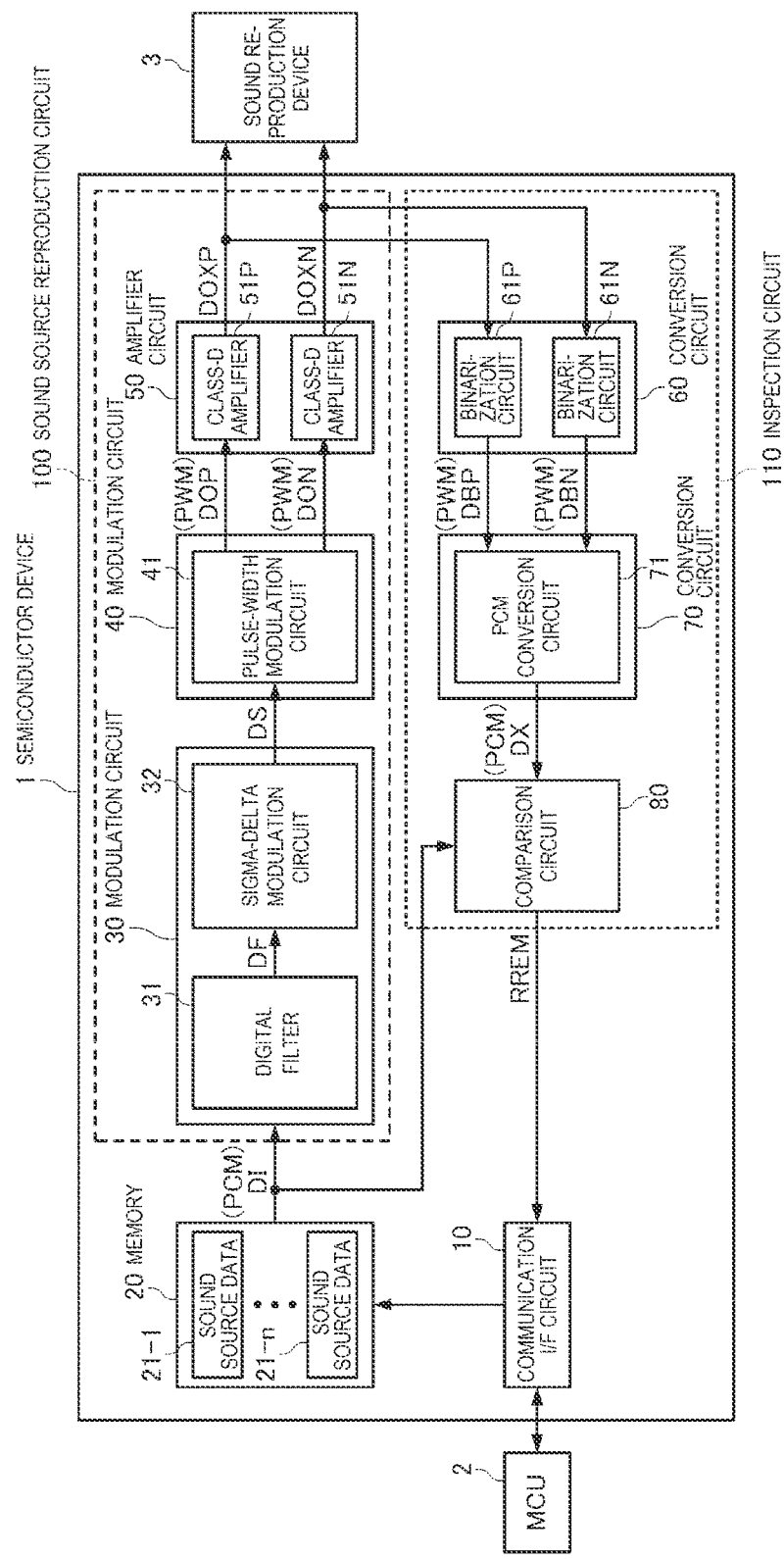
FIG. 1 is a diagram showing a configuration example of a semiconductor device according to a first embodiment.

FIG. 1 is a diagram showing a configuration example of the semiconductor device according to the first embodiment. As shown in FIG. 1, a semiconductor device 1 according to the first embodiment includes a communication interface circuit 10, a memory 20, a sound source reproduction circuit 100, and an inspection circuit 110. The semiconductor device 1 may be a single-chip semiconductor integrated circuit device, may be implemented by a multi-chip semiconductor integrated circuit device, or at least a part thereof may be implemented by an electronic component other than the semiconductor integrated circuit device.

In the memory 20, n pieces of sound source data 21-1 to 21-$n$ are stored. The n is an integer of one or more. The memory 20 may be, for example, a flash memory. Each piece of the sound source data 21-1 to 21-$n$ may be, for example, pulse-code modulated sound data, or may be adaptive differential pulse-code modulated sound data. The sound source data 21-1 to 21-$n$ may be, for example, data based on various sounds such as a sound imitating a voice when a person speaks, a mechanical warning sound, and a sound effect.

The communication interface circuit 10 is a circuit that performs data communication with a micro control unit 2. The communication interface circuit 10 may be, for example, an SPI interface circuit, or may be an I2C interface circuit. The SPI is an abbreviation for a serial peripheral interface, and the I2C is an abbreviation for an inter-integrated circuit.

The communication interface circuit 10 receives various commands transmitted from the micro control unit 2, and generates various control signals corresponding to the received commands. For example, when receiving a sound source reproduction command for sound source data 21-$i$ that is any one of the sound source data 21-1 to 21-$n$ stored in the memory 20, the communication interface circuit 10 reads the sound source data 21-$i$ from the memory 20, inputs the sound source data 21-$i$ to the sound source reproduction circuit 100 as a sound source signal DI, and instructs the sound source reproduction circuit 100 to reproduce the sound source data 21-$i$. Further, for example, when receiving a sound source stop command for the sound source data 21-$i$ in reproduction, the communication interface circuit 10 instructs the sound source reproduction circuit 100 to stop the reproduction. Further, for example, when receiving various setting commands related to the sound source reproduction, the communication interface circuit 10 performs various settings on the sound source reproduction circuit 100.

In the embodiment, the sound source signal DI input to the sound source reproduction circuit 100 is a pulse-code modulated signal. When the sound source data 21-1 to 21-$n$ is compressed sound data or the adaptive differential pulse-code modulated sound data, the sound source data 21-$i$ that is a reproduction target is converted into the sound source signal DI that is the pulse-code modulated signal by a decoder (not shown).

The sound source reproduction circuit 100 converts the sound source signal DI into amplified signals DOXP and DOXN that are sound signals, and outputs the amplified signals DOXP and DOXN to a sound reproduction device 3 coupled to the semiconductor device 1. Accordingly, sounds corresponding to the amplified signals DOXP and DOXN are output from the sound reproduction device 3. For example, the sound reproduction device 3 may be a speaker or a buzzer. The sound output from the sound reproduction device 3 may be, for example, a sound imitating a voice when a person speaks, or may be various sounds such as a mechanical warning sound or a sound effect.

As shown in FIG. 1, in the embodiment, the sound source reproduction circuit 100 includes a modulation circuit 30, a modulation circuit 40, and an amplifier circuit 50.

The modulation circuit 30 receives the sound source signal DI, sigma-delta modulates a signal based on the sound source signal DI, and outputs a sigma-delta modulated signal DS. The signal based on the sound source signal DI may be the sound source signal DI itself, or a signal obtained by performing some processing on the sound source signal DI. In the embodiment, the modulation circuit 30 includes a digital filter 31 and a sigma-delta modulation circuit 32.

The digital filter 31 is a low-pass filter that receives the sound source signal DI and outputs a signal DF obtained by reducing a high-frequency noise included in the sound source signal DI. The sigma-delta modulation circuit 32 receives the signal DF from the digital filter 31, and performs the sigma-delta modulation by oversampling the signal DF at an n-fold sampling ratio, thereby outputting the sigma-delta modulated signal DS in which a noise is biased in a high-frequency band. The n is an integer of two or more. Therefore, when a sampling frequency of the sound source signal DI is fs, a sampling frequency of the signal DF output from the digital filter 31 is fs, and a sampling frequency of the sigma-delta modulated signal DS is n×fs. The digital filter 31 functions as an antialiasing filter for reducing a high-frequency noise folded back into a signal band due to oversampling of the sigma-delta modulation circuit 32.

In this way, the modulation circuit 30 sigma-delta modulates a signal obtained by performing digital filter processing on the sound source signal DI to output the sigma-delta modulated signal DS.

The modulation circuit 40 receives the sigma-delta modulated signal DS, and pulse-width modulates a signal based on the sigma-delta modulated signal DS to output pulse-width modulated signals DOP and DON. The signal based on the sigma-delta modulated signal DS may be the sigma-delta modulated signal DS itself, or may be a signal obtained by performing some processing on the sigma-delta modulated signal DS. In the embodiment, the modulation circuit 40 includes a pulse-width modulation circuit 41.

The pulse-width modulation circuit 41 pulse-width modulates the sigma-delta modulated signal DS that is the signal based on the sound source signal DI to output pulse-width modulated signals DOP and DON. Each of the pulse-width modulated signals DOP and DON is a 1-bit digital signal. When the sampling frequency of the sigma-delta modulated signal DS is n×fs, sampling frequencies of the pulse-width modulated signals DOP and DON are n×m×fs. Here, when the number of bits of the sigma-delta modulated signal DS is M, $m=2^M$.

Figure 2:
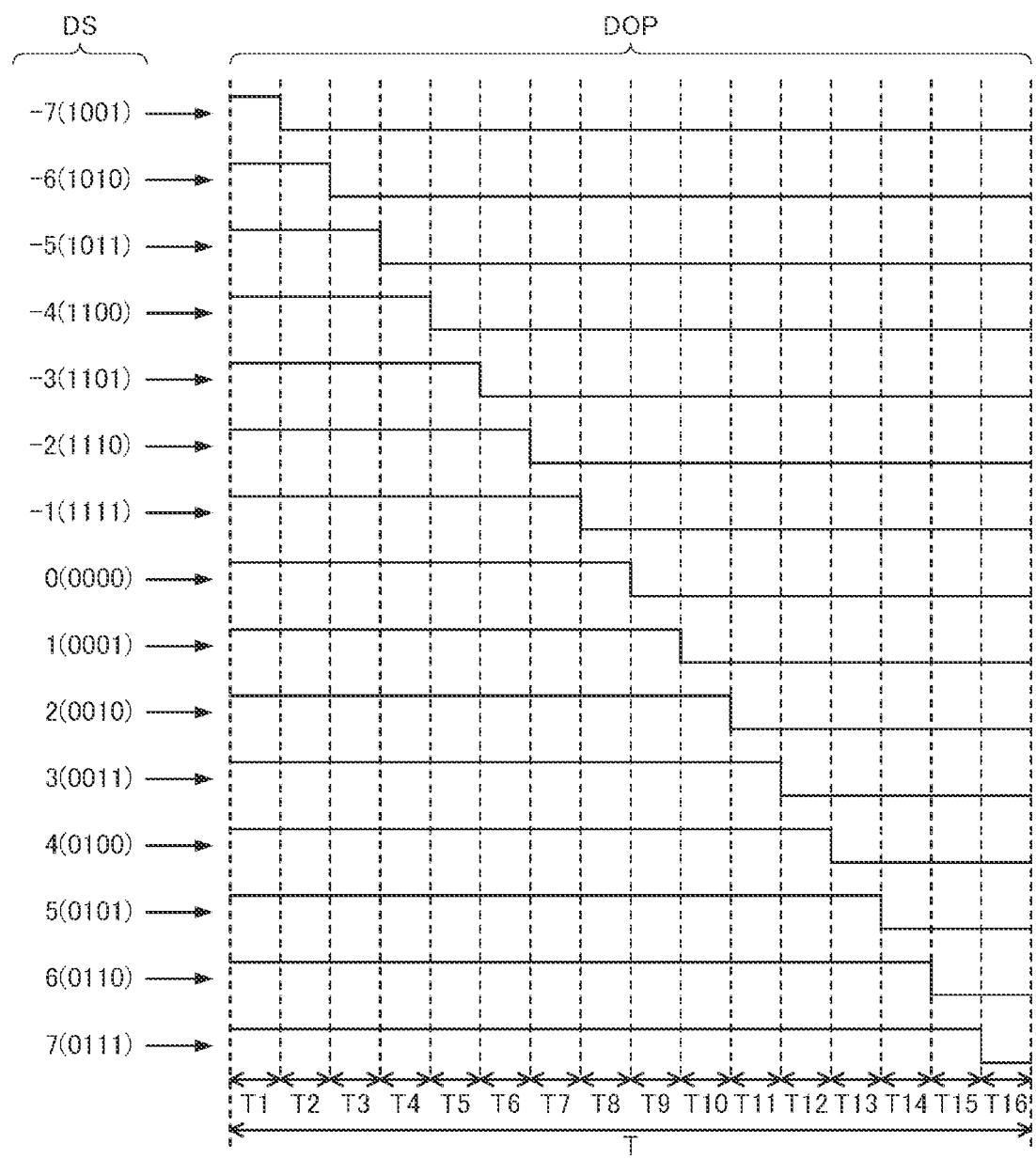
FIG. 2 is a diagram showing an example of pulse-width modulation for generating a pulse-width modulated signal DOP.
Figure 3:
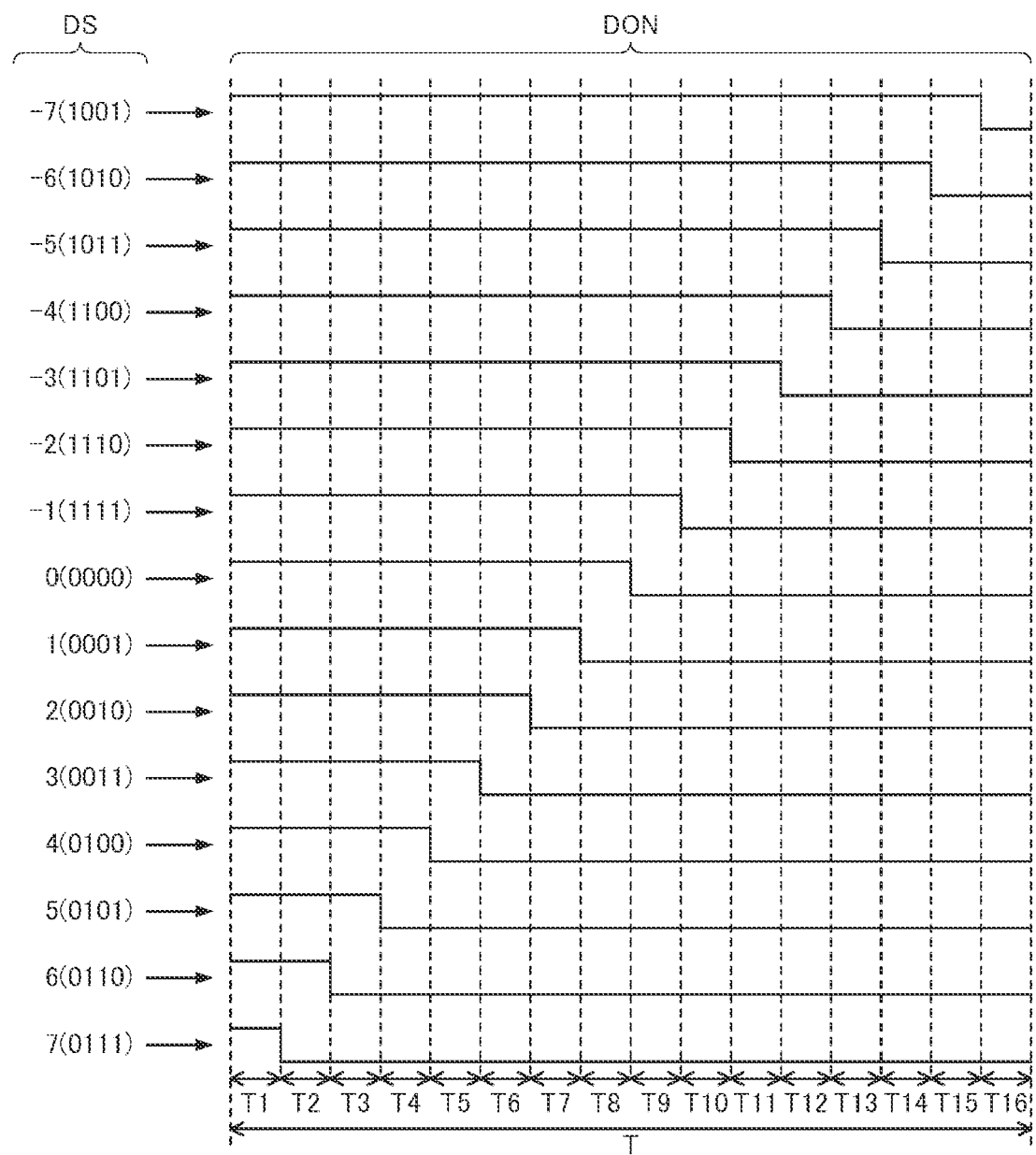
FIG. 3 is a diagram showing an example of pulse-width modulation for generating a pulse-width modulated signal DON.

The pulse-width modulation for generating the pulse-width modulated signal DOP and the pulse-width modulation for generating the pulse-width modulated signal DON are different in methods. FIG. 2 is a diagram showing an example of the pulse-width modulation for generating the pulse-width modulated signal DOP. Further, FIG. 3 is a diagram showing an example of the pulse-width modulation for generating the pulse-width modulated signal DON. FIGS. 2 and 3 show examples when the number of bits M of the sigma-delta modulated signal DS is 4. In FIGS. 2 and 3, the sigma-delta modulated signal DS is updated with a period T as a cycle, and the pulse-width modulated signals DOP and DON are at a high level or a low level in 16 sections T1 to T16 obtained by dividing the period T. That is, a length of the period T is 1/(n×fs), and a length of each of the sections T1 to T16 is 1/(n×m×fs).

As shown in FIG. 2, the larger the value of the sigma-delta modulated signal DS, the longer the pulse-width modulated signal DOP is at the high level. For example, when the sigma-delta modulated signal DS is decimal "−7", that is, binary "1001", the pulse-width modulated signal DOP is at the high level in the section T1, and is at the low level in the 15 sections T2 to T16. Further, for example, when the sigma-delta modulated signal DS is decimal "0", that is, binary "0000", the pulse-width modulated signal DOP is at the high level in the 8 sections T1 to T8, and is at the low level in the 8 sections T9 to T16. Further, for example, when the sigma-delta modulated signal DS is decimal "7", that is, binary "0111", the pulse-width modulated signal DOP is at the high level in the 15 sections T1 to T15, and is at the low level in the section T16.

As shown in FIG. 3, the larger the value of the sigma-delta modulated signal DS, the shorter the pulse-width modulated signal DON is at the high level. For example, when the sigma-delta modulated signal DS is decimal "−7", that is, binary "1001", the pulse-width modulated signal DON is at the high level in the 15 sections T1 to T15, and is at the low level in the section T16. Further, for example, when the sigma-delta modulated signal DS is decimal "0", that is, binary "0000", the pulse-width modulated signal DON is at the high level in the 8 sections T1 to T8, and is at the low level in the 8 sections T9 to T16. Further, for example, when the sigma-delta modulated signal DS is decimal "7", that is, binary "0111", the pulse-width modulated signal DON is at the high level in the section T1, and is at the low level in the 15 sections T2 to T16.

Figure 4:
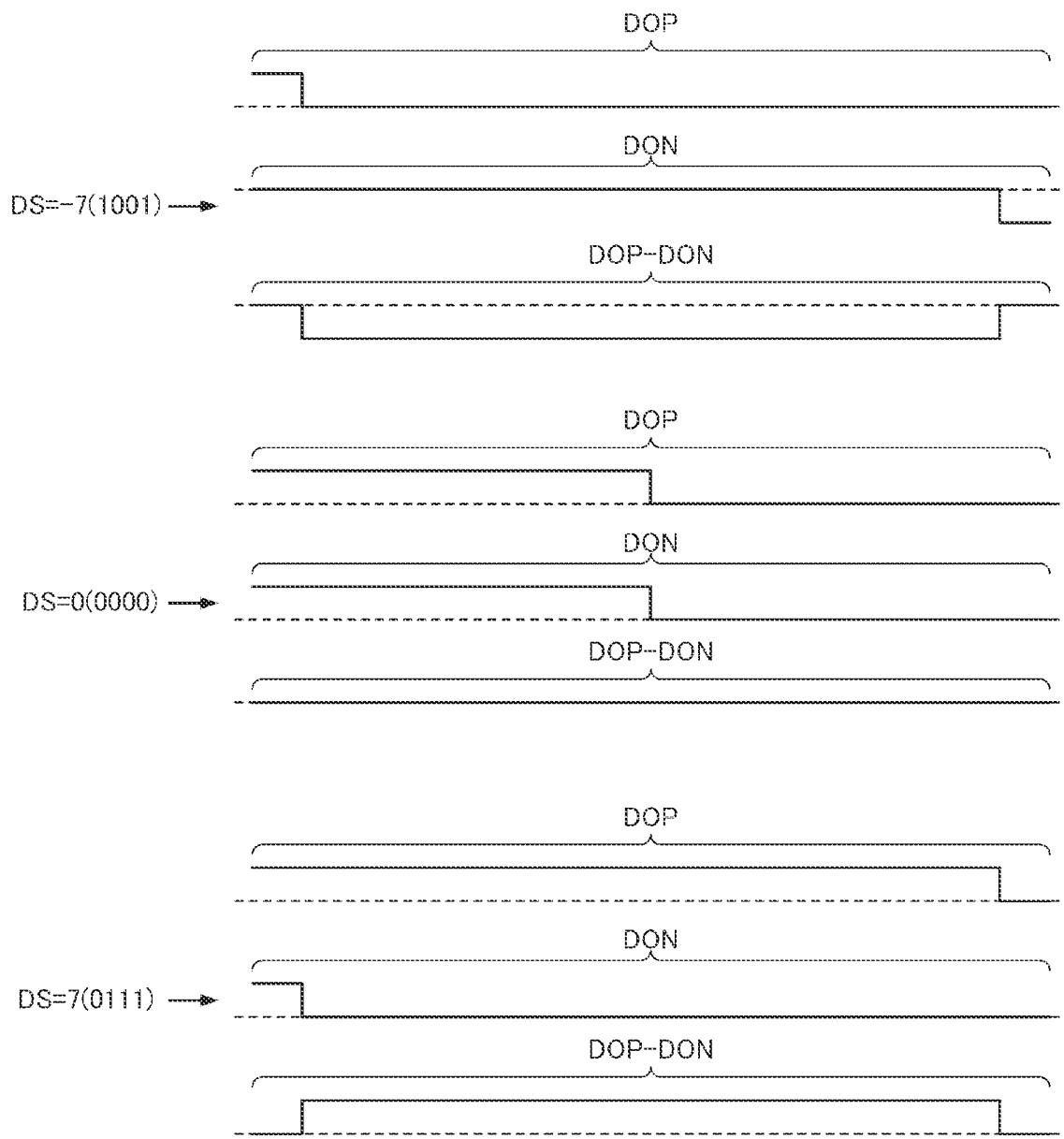
FIG. 4 is a diagram showing an example of a difference between the pulse-width modulated signal DOP and the pulse-width modulated signal DON.

Therefore, for example, a difference between the pulse-width modulated signal DOP and the pulse-width modulated signal DON when the sigma-delta modulated signal DS is the decimal "−7", "0", or "7" is as shown in FIG. 4.

Returning to the description of FIG. 1, the amplifier circuit 50 receives the pulse-width modulated signals DOP and DON, and outputs the amplified signals DOXP and DOXN obtained by amplifying the pulse-width modulated signals DOP and DON to the sound reproduction device 3. In the embodiment, the amplifier circuit 50 includes two class-D amplifiers 51P and 51N. The class-D amplifier 51P outputs the amplified signal DOXP obtained by class-D amplifying the pulse-width modulated signal DOP. The class-D amplifier 51N outputs the amplified signal DOXN obtained by class-D amplifying the pulse-width modulated signal DON. The sound reproduction device 3 reproduces a sound having a magnitude corresponding to a voltage difference between the amplified signal DOXP and the amplified signal DOXN.

The inspection circuit 110 is a circuit that inspects the sound source reproduction circuit 100. As shown in FIG. 1, in the embodiment, the inspection circuit 110 includes a conversion circuit 60, a conversion circuit 70, and a comparison circuit 80.

The conversion circuit 60 receives the amplified signals DOXP and DOXN from the amplifier circuit 50, and converts the amplified signals DOXP and DOXN into pulse-width modulated signals DBP and DBN. In the embodiment, the conversion circuit 60 includes two binarization circuits 61P and 61N. The binarization circuit 61P generates the pulse-width modulated signal DBP by binarizing the amplified signal DOXP. The binarization circuit 61N generates the pulse-width modulated signal DBN by binarizing the amplified signal DOXN.

Figure 5:
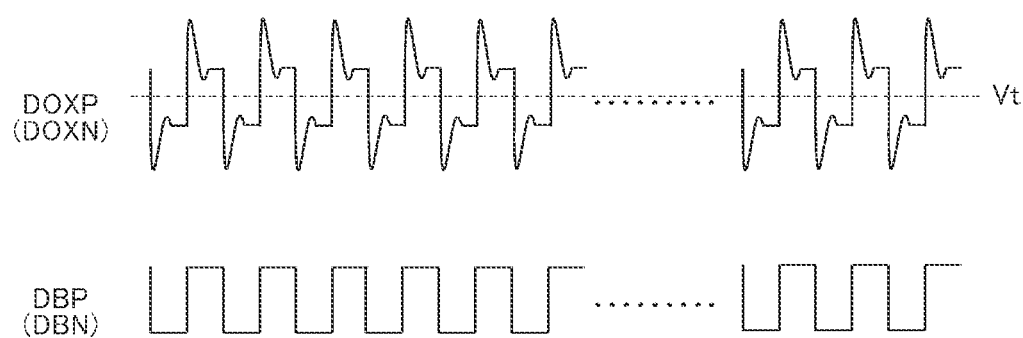
FIG. 5 is a diagram illustrating an operation of a binarization circuit.

As shown in FIG. 5, in the amplified signals DOXP and DOXN, an overshoot occurs at a rising edge, and an undershoot occurs at a falling edge. The binarization circuit 61P is, for example, a comparator that compares a voltage of the amplified signal DOXP with a threshold voltage Vt, and outputs the pulse-width modulated signal DBP that is at a high level when the voltage of the amplified signal DOXP is higher than the threshold voltage Vt, and that is at a low level when the voltage of the amplified signal DOXP is lower than the threshold voltage Vt. Similarly, the binarization circuit 61N is, for example, a comparator that compares a voltage of the amplified signal DOXN with the threshold voltage Vt, and outputs the pulse-width modulated signal DBN that is at a high level when the voltage of the amplified signal DOXN is higher than the threshold voltage Vt, and that is at a low level when the voltage of the amplified signal DOXN is lower than the threshold voltage Vt. By the binarization circuits 61P and 61N, the overshoots or the undershoots of the amplified signals DOXP and DOXN are removed, and the pulse-width modulated signals DBP and DBN in each of which the high level is shifted to a power supply voltage of a logic circuit are obtained.

Returning to the description of FIG. 1, the conversion circuit 70 receives the pulse-width modulated signals DBP and DBN based on the pulse-width modulated signals DOP and DON, and converts the pulse-width modulated signals DBP and DBN into a pulse-code modulated signal DX. In the embodiment, the conversion circuit 70 includes a PCM conversion circuit 71. The PCM is an abbreviation for pulse code modulation.

Figure 6:
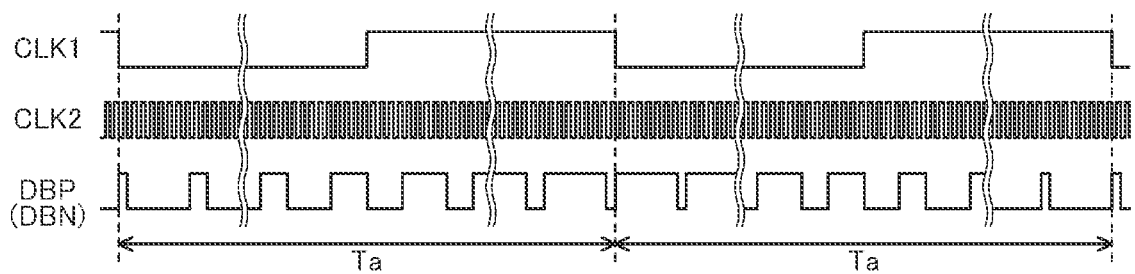
FIG. 6 is a diagram illustrating an operation of a PCM conversion circuit.

The PCM conversion circuit 71 converts the pulse-width modulated signals DBP and DBN into the pulse-code modulated signal DX based on a clock signal CLK1 (not shown) having a frequency of fs and a clock signal CLK2 (not shown) having a frequency of n×m×fs. Specifically, as shown in FIG. 6, the PCM conversion circuit 71 counts high levels of the pulse-width modulated signals DBP and DBN by the clock signal CLK2 in a cycle Ta of the clock signal CLK1. That is, the PCM conversion circuit 71 integrates the pulse-width modulated signals DBP and DBN in the cycle Ta. The PCM conversion circuit 71 generates the pulse-code modulated signal DX based on an integrated value of the pulse-width modulated signals DBP and DBN. The conversion from the pulse-width modulated signals DBP and DBN to the pulse-code modulated signal DX corresponds to inverse conversion of the conversion from the signal DF to the pulse-width modulated signals DOP and DON.

In this way, the conversion circuit 70 generates the pulse-code modulated signal DX by integrating the pulse-width modulated signals DBP and DBN in a predetermined cycle.

The comparison circuit 80 receives the sound source signal DI that is the pulse-code modulated signal and the pulse-code modulated signal DX, converts the sound source signal DI into a comparison target signal DI_R by an inversely convertible conversion method, converts the pulse-code modulated signal DX into a comparison target signal DX_R by the conversion method, and compares the comparison target signal DI_R with the comparison target signal DX_R. In practice, since a predetermined time is required from when the sound source signal DI is input to the modulation circuit 30 to when the pulse-code modulated signal DX corresponding to the sound source signal DI is generated, the comparison circuit 80 delays the sound source signal DI by the predetermined time, and converts the sound source signal DI into the comparison target signal DI_R.

Figure 7:
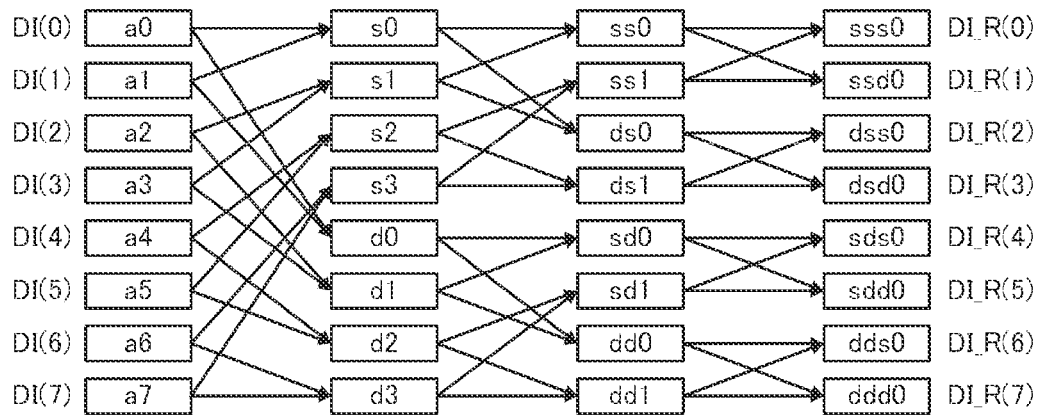
FIG. 7 is a diagram showing an example of converting a sound source signal into a comparison target signal by wavelet packet analysis.

In the embodiment, the inversely convertible conversion method by which the comparison circuit 80 converts the sound source signal DI and the pulse-code modulated signal DX into the comparison target signal DI_R and the comparison target signal DX_R is wavelet packet analysis. FIG. 7 shows an example of converting the sound source signal DI into the comparison target signal DI_R by the wavelet packet analysis. In the example in FIG. 7, eight successive samples DI (0) to DI (7) of the sound source signal DI are converted into eight samples DI_R (0) to DI_R (7) of the comparison target signal DI_R. Values of DI (0) to DI (7) are a0 to a7, respectively.

In FIG. 7, s0=a0+a1, s1=a2+a3, s2=a4+a5, s3=a6+a7, d0=a0−a1, s1=a2−a3, s2=a4−a5, and s3=a6−a7. Further, ss0=s0+s1, ss1=s2+s3, ds0=s0−s1, ds1=s2−s3, sd0=d0+d1, sd1=d2+d3, dd0=d0−d1, and dd1=d2−d3. Further, sss0=ss0+ss1, ssd0=ss0−ss1, dss0=ds0+ds1, dsd0=ds0−ds1, sds0=sd0+sd1, sdd0=sd0−sd1, dds0=dd0+dd1, and ddd0=dd0−dd1. The values of DI_R (0) to DI_R (7) are sss0, ssd0, dss0, dsd0, sds0, sdd0, dds0, and ddd0, respectively.

Here, a0=(s0+d0)/2, a1=(s0−d0)/2, s0=(ss0+ds0)/2, and d0=(sd0+dd0)/2. Further, ss0=(sss0+ssd0)/2, ds0=(dss0+dsd0)/2, sd0=(sds0+sdd0)/2, and dd0=(dds0+ddd0)/2. Therefore, DI (0) and DI (1) can be restored from DI_R (0) to DI_R (7). Similarly, DI (2) to DI (7) can also be restored from DI_R (0) to DI_R (7). That is, the wavelet packet analysis is the inversely convertible conversion method.

Since an example in which the pulse-code modulated signal DX is converted into the comparison target signal DX_R by the wavelet packet analysis is also similar to that in FIG. 7, illustration and description thereof will be omitted.

Returning to the description of FIG. 1, the comparison circuit 80 may compare the comparison target signal DI_R with the comparison target signal DX_R by calculating a correlation value RREM between the comparison target signal DI_R and the comparison target signal DX_R. For example, the correlation value RREM is calculated by Equation (1), and the smaller the difference between the comparison target signal DI_R and the comparison target signal DX_R is, the larger the value is.

$$RREM = \frac{\sum_{i=0}^{N-1} |DI\_R(i)|}{\sum_{i=0}^{N-1} |(DI\_R(i) - DX\_R(i))|} \quad (1)$$

When receiving a command for reading the correlation value RREM from the micro control unit 2, the communication interface circuit 10 acquires the correlation value RREM from the comparison circuit 80, and transmits the correlation value RREM to the micro control unit 2. For example, the micro control unit 2 can determine presence or absence of a failure in the sound source reproduction circuit 100 based on the correlation value RREM.

Here, when the sound source reproduction circuit 100 fails, the difference between the sound source signal DI and the pulse-code modulated signal DX is not zero, and even if the sound source reproduction circuit 100 is normal, the difference between the sound source signal DI and the pulse-code modulated signal DX may not be zero due to an influence of a noise or the like. In the embodiment, since the inspection circuit 110 calculates the correlation value RREM using the wavelet packet analysis having characteristics of dispersing an error, the micro control unit 2 can correctly make determination based on the correlation value RREM even if the sound source reproduction circuit 100 is normal and the difference between the sound source signal DI and the pulse-code modulated signal DX is not zero. Therefore, when the sound source reproduction circuit 100 is normal, the micro control unit 2 is less likely to erroneously determine that the sound source reproduction circuit 100 fails is reduced.

In the first embodiment, the sound source signal DI is an example of a "first pulse-code modulated signal", and the pulse-code modulated signal DX is an example of a "second pulse-code modulated signal". Further, the pulse-width modulated signals DOP and DON are examples of a "first pulse-width modulated signal", and the pulse-width modulated signals DBP and DBN are examples of a "second pulse-width modulated signal". Further, the conversion circuit 70 is an example of a "first conversion circuit", and the conversion circuit 60 is an example of a "second conversion circuit". Further, the comparison target signal DI_R is an example of a "first comparison target signal", and the comparison target signal DX_R is an example of a "second comparison target signal".

The semiconductor device 1 according to the first embodiment has a configuration that can cause one sound reproduction device 3 to output a sound, and may have a configuration that can cause a plurality of sound output devices to output sounds.

As described above, in the semiconductor device 1 according to the first embodiment, the pulse-width modulation circuit 41 pulse-width modulates the sigma-delta modulated signal DS based on the sound source signal DI that is the pulse-code modulated signal, and outputs the pulse-width modulated signals DOP and DON, and the conversion circuit 60 binarizes the amplified signals DOXP and DOXN obtained by amplifying the pulse-width modulated signals DOP and DON, and outputs the pulse-width modulated signals DBP and DBN. Further, the conversion circuit 70 converts the pulse-width modulated signals DBP and DBN into the pulse-code modulated signal DX, and the comparison circuit 80 converts the sound source signal DI into the comparison target signal DI_R by the wavelet packet analysis, converts the pulse-code modulated signal DX into the comparison target signal DX_R by the wavelet packet analysis, compares the comparison target signal DI_R with the comparison target signal DX_R, and calculates the correlation value RREM.

Here, the conversion circuit 60 removes overshoots or undershoots generated in the pulse-width modulated amplified signals DOXP and DOXN, and no useful information is lost during the conversion from the amplified signals DOXP and DOXN into the pulse-width modulated signals DBP and DBN. Further, the conversion circuit 70 can convert the pulse-width modulated signals DBP and DBN into the pulse-code modulated signal DX without losing the information by integrating the pulse-width modulated signals DBP and DBN in the predetermined cycle. Further, since the wavelet packet analysis is the inversely convertible conversion method, the sound source signal DI and the pulse-code modulated signal DX can be restored from the comparison target signal DI_R and the comparison target signal DX_R, respectively. In other words, no information is lost even if the comparison circuit 80 converts the sound source signal DI and the pulse-code modulated signal DX into the comparison target signal DI_R and the comparison target signal DX_R, respectively.

Therefore, according to the semiconductor device 1 in the first embodiment, the comparison circuit 80 can accurately calculate the correlation value RREM indicating correlation between the sound source signal DI and the pulse-code modulated signal DX by comparing the comparison target signal DI_R and the comparison target signal DX_R with each other in each of which no information is lost. Therefore, the micro control unit 2 can accurately detect a failure in the sound source reproduction circuit 100 based on the correlation value RREM output from the comparison circuit 80.

According to the semiconductor device 1 in the first embodiment, since the comparison circuit 80 calculates the correlation value RREM using the wavelet packet analysis having the characteristics of dispersing the error, the micro control unit 2 is less likely to erroneously determine that the sound source reproduction circuit 100 fails when the sound source reproduction circuit 100 is normal based on the correlation value RREM.

According to the semiconductor device 1 in the first embodiment, since a circuit having a large size such as an A/D converter or a digital filter is not necessary in the inspection circuit 110, an increase amount of a circuit area due to addition of the inspection circuit 110 is reduced.

1-2. Second Embodiment

Hereinafter, for the semiconductor device 1 according to the second embodiment, configurations similar to those of the first embodiment are denoted by the same reference numerals, description similar to that of the first embodiment will be omitted or simplified, and content different from that of the first embodiment will be mainly described.

Figure 8:
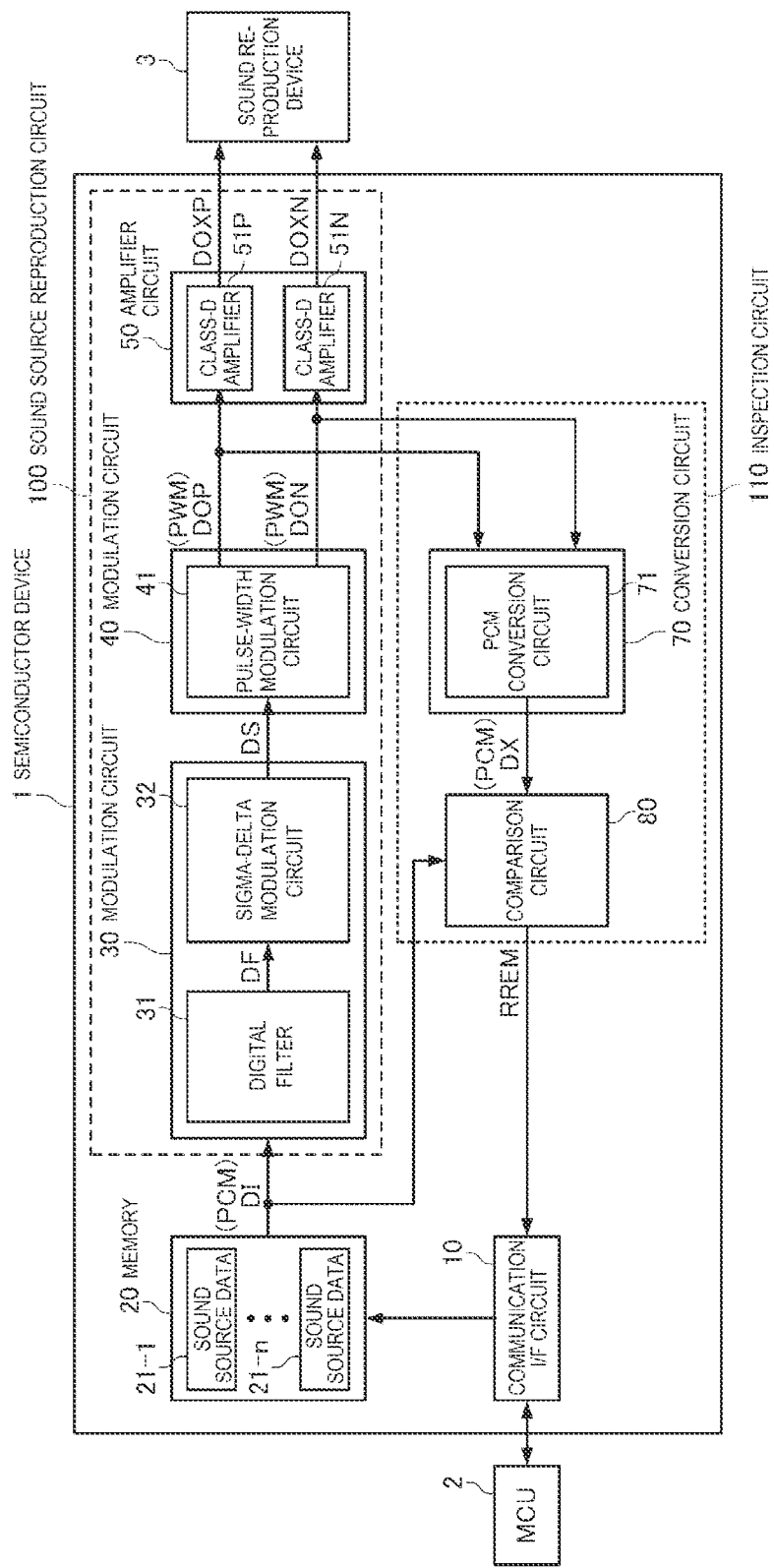
FIG. 8 is a diagram showing a configuration example of a semiconductor device according to a second embodiment.

FIG. 8 is a diagram showing a configuration example of the semiconductor device 1 according to the second embodiment. As shown in FIG. 8, the semiconductor device 1 according to the second embodiment is different from the semiconductor device 1 according to the first embodiment shown in FIG. 1 in that the inspection circuit 110 does not include the conversion circuit 60, and that the pulse-width modulated signals DOP and DON are input to the conversion circuit 70. That is, in the second embodiment, the conversion circuit 70 receives the pulse-width modulated signals DOP and DON, and converts the pulse-width modulated signals DOP and DON into the pulse-code modulated signal DX.

In the embodiment, the PCM conversion circuit 71 provided in the conversion circuit 70 converts the pulse-width modulated signals DOP and DON into the pulse-code modulated signal DX based on the clock signal CLK1 (not shown) having the frequency of fs and the clock signal CLK2 (not shown) having the frequency of n×m×fs. Specifically, similarly to the case shown in FIG. 6, the PCM conversion circuit 71 counts high levels of the pulse-width modulated signals DOP and DON by the clock signal CLK2 in the cycle Ta of the clock signal CLK1. That is, the PCM conversion circuit 71 integrates the pulse-width modulated signals DOP and DON in the cycle Ta. The PCM conversion circuit 71 generates the pulse-code modulated signal DX based on an integrated value of the pulse-width modulated signals DOP and DON. The conversion from the pulse-width modulated signals DOP and DON into the pulse-code modulated signal DX corresponds to inverse conversion of the conversion from the signal DF into the pulse-width modulated signals DOP and DON.

In this way, the conversion circuit 70 integrates the pulse-width modulated signals DOP and DON in the predetermined cycle to generate the pulse-code modulated signal DX.

Since other configurations of the semiconductor device 1 according to the second embodiment are similar to those in FIG. 1, description thereof will be omitted.

In the second embodiment, the sound source signal DI is an example of the "first pulse-code modulated signal", and the pulse-code modulated signal DX is an example of the "second pulse-code modulated signal". Further, the pulse-width modulated signals DOP and DON are examples of the "first pulse-width modulated signal" and examples of the "second pulse-width modulated signal". Further, the conversion circuit 70 is an example of the "first conversion circuit". Further, the comparison target signal DI_R is an example of the "first comparison target signal", and the comparison target signal DX_R is an example of the "second comparison target signal".

The semiconductor device 1 according to the second embodiment has the configuration that can cause one sound reproduction device 3 to output a sound, and may have a configuration that can cause a plurality of sound output devices to output sounds.

According to the semiconductor device 1 in the second embodiment described above, effects similar to those of the semiconductor device 1 according to the first embodiment are achieved. Further, according to the semiconductor device 1 in the second embodiment, since presence or absence of a failure in the amplifier circuit 50 is not reflected in the correlation value RREM, a failure detection accuracy of the micro control unit 2 decreases. However, since the conversion circuit 60 is not necessary in the inspection circuit 110, the increase amount of the circuit area due to the addition of the inspection circuit 110 is further reduced.

1-3. Third Embodiment

Hereinafter, for the semiconductor device 1 according to the third embodiment, configurations similar to those of the first embodiment or the second embodiment are denoted by the same reference numerals, description similar to that of the first embodiment or the second embodiment will be omitted or simplified, and content different from that of the first embodiment and the second embodiment will be mainly described.

Figure 9:
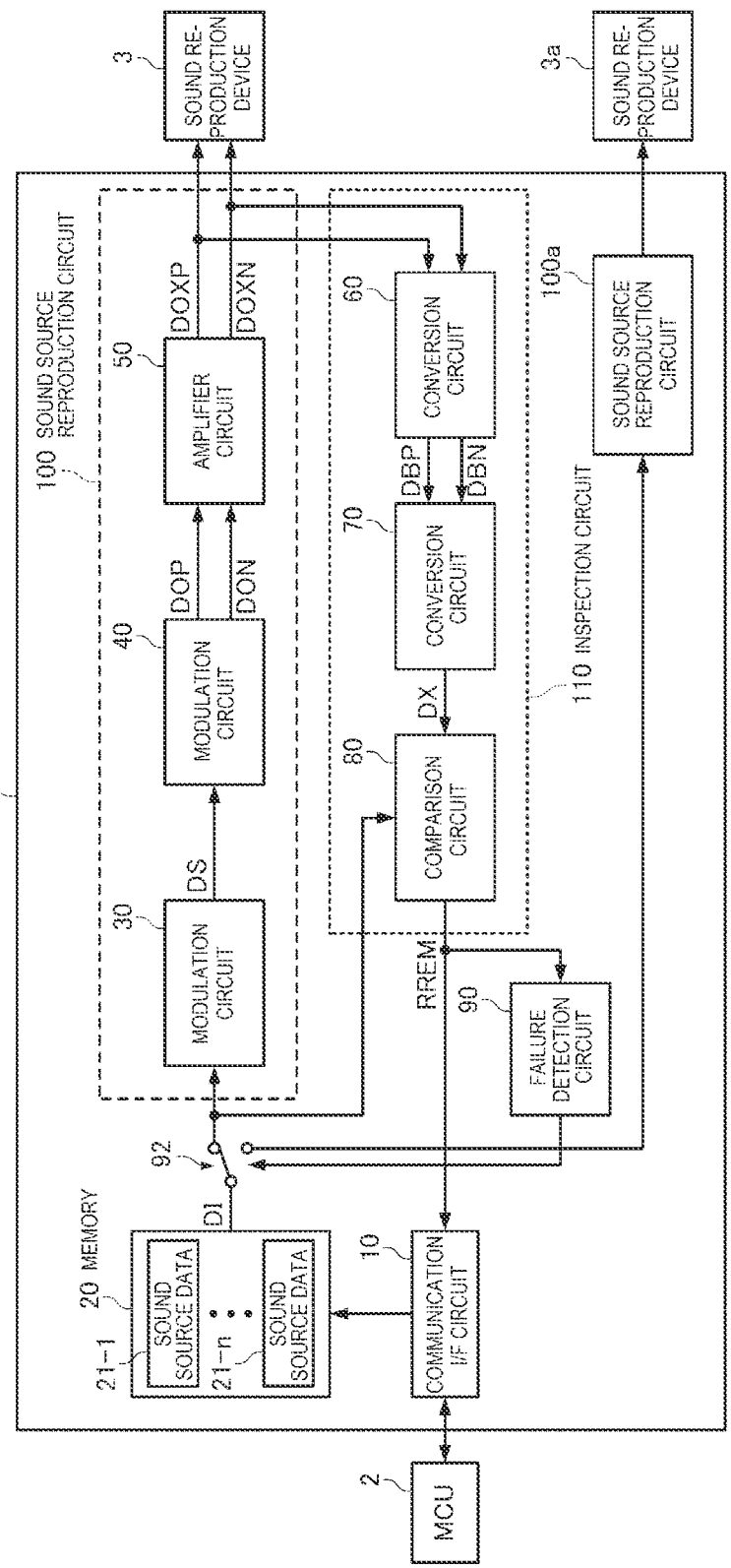
FIG. 9 is a diagram showing a configuration example of a semiconductor device according to a third embodiment.

FIG. 9 is a diagram showing a configuration example of the semiconductor device 1 according to the third embodiment. As shown in FIG. 9, the semiconductor device 1 according to the third embodiment is different from the semiconductor device 1 according to the first embodiment shown in FIG. 1 in that a failure detection circuit 90, a switch 92, and a sound source reproduction circuit 100a are provided.

The switch 92 outputs the sound source signal DI to either one of the sound source reproduction circuit 100 and the sound source reproduction circuit 100a in response to a control signal output from the failure detection circuit 90.

The failure detection circuit 90 detects a failure in the sound source reproduction circuit 100 based on a comparison result of the comparison circuit 80. Specifically, the failure detection circuit 90 compares the correlation value RREM that is the comparison result of the comparison circuit 80 with a predetermined threshold, and detects a failure in the sound source reproduction circuit 100 when the correlation value RREM is smaller than the predetermined threshold. For example, the communication interface circuit 10 may receive a command for setting the threshold transmitted from the micro control unit 2 and set the threshold.

When the failure in the sound source reproduction circuit 100 is detected, the failure detection circuit 90 causes the sound reproduction device 3a different from the sound reproduction device 3 to output a signal based on the sound source signal DI. The signal based on the sound source signal DI may be the sound source signal DI itself, or a signal obtained by performing some processing on the sound source signal DI. Specifically, when the failure in the sound source reproduction circuit 100 is detected, the failure detection circuit 90 switches the switch 92 such that the sound source signal DI is input to the sound source reproduction circuit 100a. The sound source reproduction circuit 100a converts the sound source signal DI into a sound signal, and outputs the sound signal to the sound reproduction device 3a coupled to the semiconductor device 1. Accordingly, output of a sound from the sound reproduction device 3 is stopped, and a sound corresponding to the sound signal is output from the sound reproduction device 3a. For example, the sound source reproduction circuit 100a may have a configuration similar to that of the sound source reproduction circuit 100 or a simpler configuration. Further, for example, the sound reproduction device 3a may be a speaker or a buzzer. The sound output from the sound reproduction device 3a may be, for example, a sound imitating a voice when a person speaks, or may be various sounds such as a mechanical warning sound or a sound effect.

Since other configurations of the semiconductor device 1 according to the third embodiment are similar to those in FIG. 1, description thereof will be omitted.

In the third embodiment, the sound source signal DI is an example of the "first pulse-code modulated signal", and the pulse-code modulated signal DX is an example of the "second pulse-code modulated signal". Further, the pulse-width modulated signals DOP and DON are examples of the "first pulse-width modulated signal", and the pulse-width modulated signals DBP and DBN are examples of the "second pulse-width modulated signal". Further, the conversion circuit 70 is an example of the "first conversion circuit", and the conversion circuit 60 is an example of the "second conversion circuit". Further, the comparison target signal DI_R is an example of the "first comparison target signal", and the comparison target signal DX_R is an example of the "second comparison target signal". Further, the sound reproduction device 3 is an example of a "first sound reproduction device", and the sound reproduction device 3a is an example of a "second sound reproduction device".

The semiconductor device 1 according to the third embodiment has the configuration that can output sounds to the two sound reproduction devices 3 and 3a, and may have the configuration that can output sounds to three or more sound output devices.

According to the semiconductor device 1 in the third embodiment described above, effects similar to those of the semiconductor device 1 according to the first embodiment or the second embodiment are achieved. Further, in the semiconductor device 1 according to the third embodiment, the failure detection circuit 90 can accurately detect a failure in the sound source reproduction circuit 100 based on the highly accurate correlation value RREM output from the comparison circuit 80. When the sound source reproduction circuit 100 fails, the failure detection circuit 90 can cause the sound reproduction device 3a to generate a normal sound without causing the sound reproduction device 3 to generate an abnormal sound.

1-4. Modifications

The present disclosure is not limited to the embodiments, and various modifications can be made within a scope of gist of the present disclosure.

For example, in the embodiments described above, the inversely convertible conversion method in which the comparison circuit 80 respectively converts the sound source signal DI and the pulse-code modulated signal DX into the comparison target signal DI_R and the comparison target signal DX_R is the wavelet packet analysis, and may be wavelet conversion.

For example, in the embodiments described above, the memory 20 in which the sound source data 21-1 to 21-n is stored is incorporated into the semiconductor device 1. Alternatively, instead of using the memory 20, an external memory in which the sound source data 21-1 to 21-n is stored may be coupled to the semiconductor device 1, and the semiconductor device 1 may read the sound source data 21-i that is the sound source signal DI from the external memory. Alternatively, instead of using the memory 20, the micro control unit 2 may incorporate a memory in which the sound source data 21-1 to 21-n is stored, and the micro control unit 2 may read the sound source data 21-i from the memory and transmit the sound source data 21-i to the semiconductor device 1 as the sound source signal DI.

Figure 10:
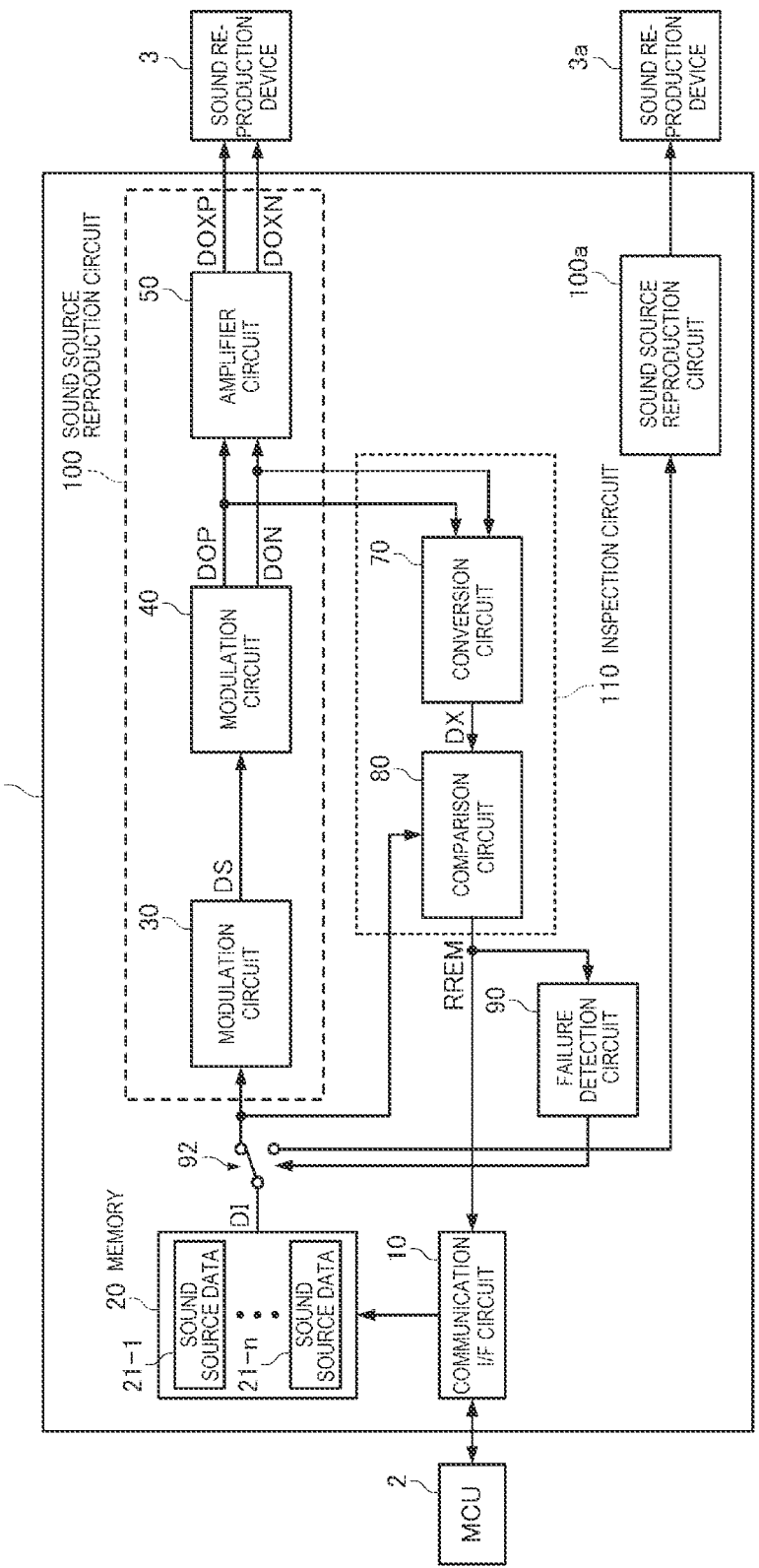
FIG. 10 is a diagram showing a configuration example of a semiconductor device according to a modification.

For example, in the semiconductor device 1 according to the third embodiment described above, the failure detection circuit 90, the switch 92, and the sound source reproduction circuit 100a are added to the semiconductor device 1 according to the first embodiment, and as shown in FIG. 10, the semiconductor device 1 according to the third embodiment may have a configuration in which these circuits are added to the semiconductor device 1 according to the second embodiment.

Figure 11:
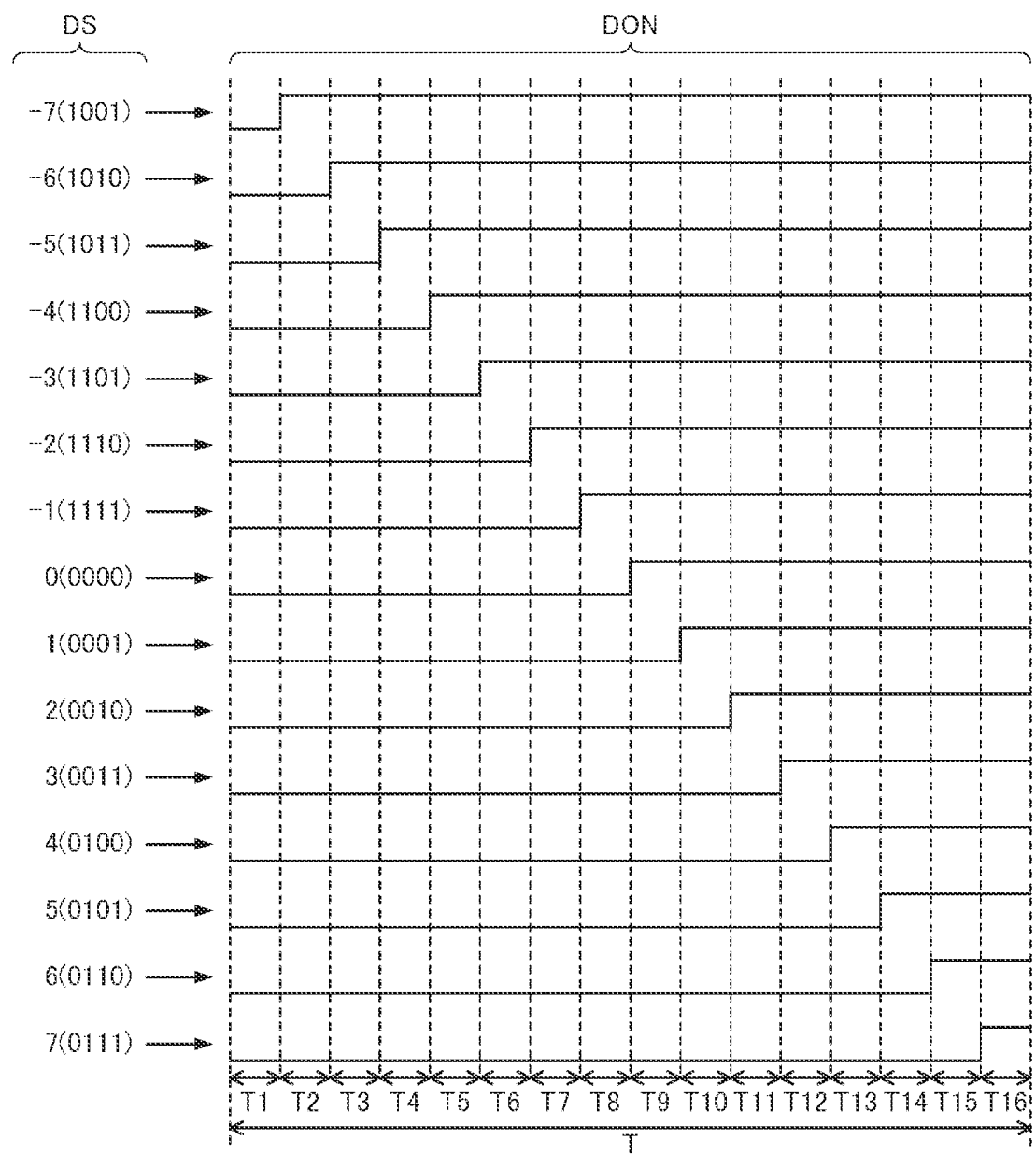
FIG. 11 is a diagram showing another example of the pulse-width modulation for generating the pulse-width modulated signal DON.
Figure 12:
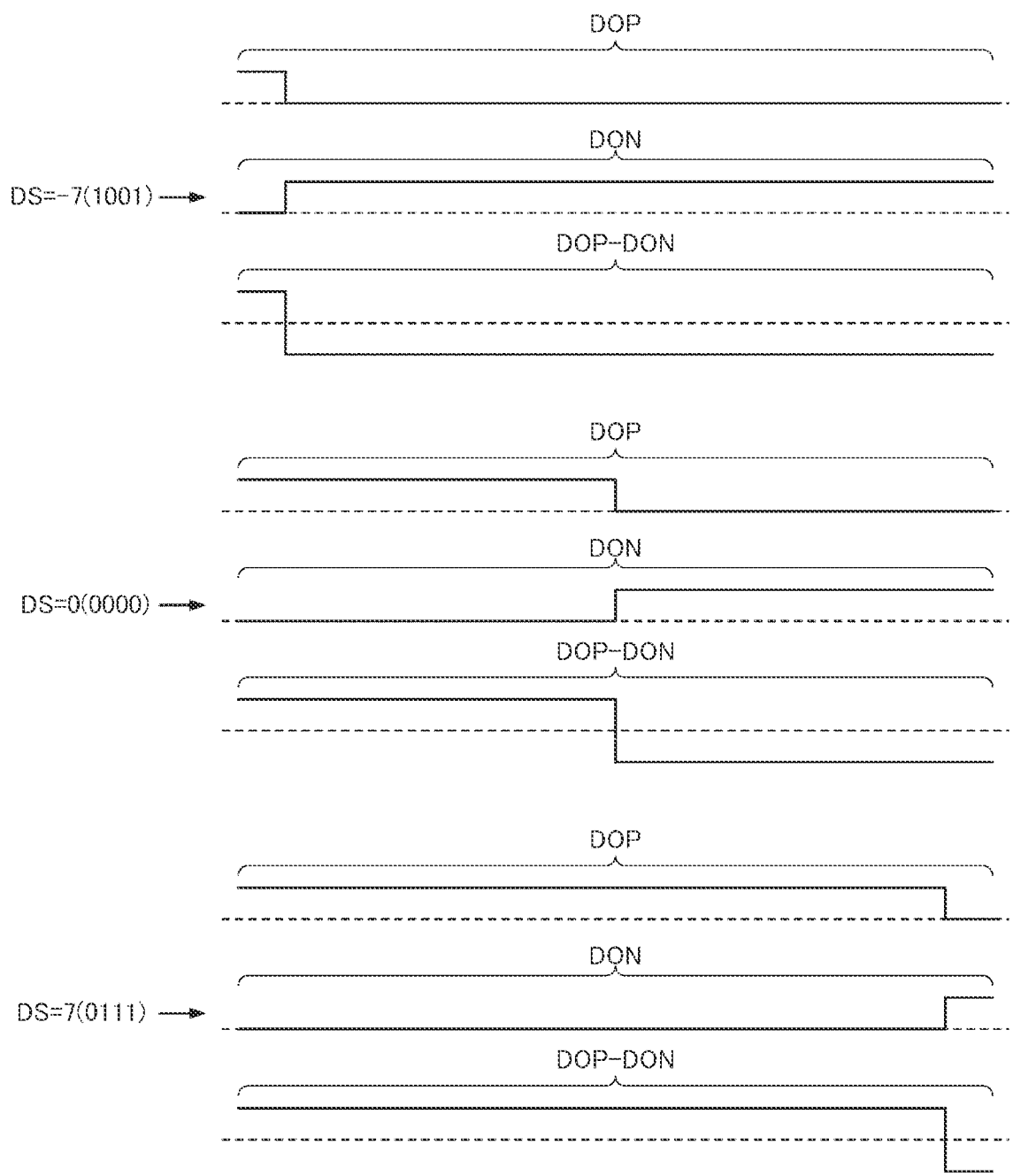
FIG. 12 is a diagram showing another example of the difference between the pulse-width modulated signal DOP and the pulse-width modulated signal DON.

For example, in the embodiments described above, the examples in FIGS. 2 to 4 are given as the modulation method performed by the pulse-width modulation circuit 41. Alternatively, other modulation methods may be used. For example, pulse-width modulation for generating the pulse-width modulated signal DOP may use a method the same as that in FIG. 2, and pulse-width modulation for generating the pulse-width modulated signal DON may use the method shown in FIG. 11. In an example in FIG. 11, the pulse-width modulated signal DON is a signal obtained by inverting a logic level of the pulse-width modulated signal DOP shown in FIG. 2, and the larger the value of the sigma-delta modulated signal DS is, the shorter the high-level time is. For example, when the sigma-delta modulated signal DS is decimal "−7", that is, binary "1001", the pulse-width modulated signal DON is at a low level in the section T1, and is at a high level in the 15 sections T2 to T16. Further, for example, when the sigma-delta modulated signal DS is decimal "0", that is, binary "0000", the pulse-width modulated signal DON is at the low level in the 8 sections T1 to T8, and is at the high level in the 8 sections T9 to T16. Further, for example, when the sigma-delta modulated signal DS is decimal "7", that is, binary "0111", the pulse-width modulated signal DON is at the low level in the 15 sections T1 to T15, and is at the high level in the section T16. Therefore, for example, a difference between the pulse-width modulated signal DOP and the pulse-width modulated signal DON when the sigma-delta modulated signal DS is the decimal "−7", "0", or "7" is as shown in FIG. 12.

2. Electronic Apparatus

Figure 13:
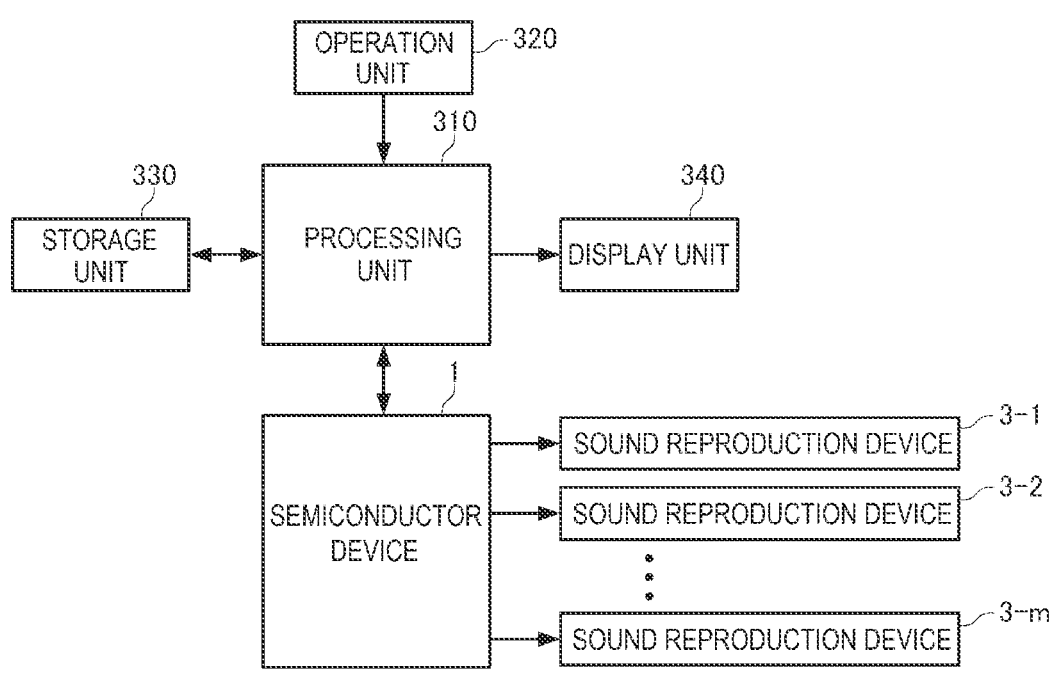
FIG. 13 is a functional block diagram of an electronic apparatus according to the embodiment.

FIG. 13 is a functional block diagram showing an example of a configuration of the electronic apparatus according to the embodiment using the semiconductor device 1 according to the embodiments.

As shown in FIG. 13, an electronic apparatus 300 according to the embodiment includes the semiconductor device 1, m sound reproduction devices 3-1 to 3-m, a processing unit 310, an operation unit 320, a storage unit 330, and a display unit 340. The electronic apparatus 300 according to the embodiment may have a configuration in which some constituent elements in FIG. 13 are omitted or changed, or other constituent elements are added.

The processing unit 310 performs control processing and various kinds of data processing of the units of the electronic apparatus 300. For example, the processing unit 310 transmits various commands to the semiconductor device 1, and controls an operation of the semiconductor device 1. Further, the processing unit 310 performs various kinds of processing in response to an operation signal from the operation unit 320, processing of transmitting a display signal for displaying various kinds of information on the display unit 340, and the like. For example, the processing unit 310 may be the micro control unit 2 described above.

The operation unit 320 is an input device implemented by operation keys, button switches, and the like, and outputs an operation signal in response to an operation performed by a user to the processing unit 310.

The storage unit 330 stores programs, data, and the like for performing various kinds of calculation processing and control processing by the processing unit 310. The storage unit 330 is implemented by, for example, a hard disk, a flexible disk, an MO, an MT, various memories, a CD-ROM, or a DVD-ROM.

The display unit 340 is a display device implemented by an LCD or the like, and displays various kinds of information based on an input display signal. The LCD is an abbreviation for a liquid crystal display. A touch panel that functions as the operation unit 320 may be provided in the display unit 340.

The semiconductor device 1 generates a sound signal based on various commands transmitted from the processing unit 310, and outputs the generated sound signal to the sound reproduction device 3-1. The sound reproduction device 3-1 corresponds to the sound reproduction device 3 described above. Further, the semiconductor device 1 may inspect the sound source reproduction circuit 100 described above and transmit an inspection result to the processing unit 310, and the processing unit 310 may determine presence or absence of a failure in the sound source reproduction circuit 100. Alternatively, when the failure in the sound source reproduction circuit 100 is detected, the semiconductor device 1 may switch an output destination of the sound signal from the sound reproduction device 3-1 to the sound reproduction device 3-2. The sound reproduction device 3-2 corresponds to the sound reproduction device 3a described above.

Since the semiconductor device 1 can generate the signal required for accurately detecting a failure in the sound source reproduction circuit 100, it is possible to implement the highly reliable electronic apparatus 300.

As such an electronic apparatus 300, various electronic apparatuses are considered, and examples thereof include: various household electrical appliances such as a warning device, a rice cooker, an IH cooking heater, a vacuum cleaner, and a washing machine, an electronic timepiece, a personal computer such as a mobile computer, a laptop computer, or a tablet computer, a mobile terminal such as a smartphone or a mobile phone, an inkjet ejection device such as a digital camera or an inkjet printer, a storage area network apparatus such as a router or a switch, a local area network apparatus, a mobile terminal base station apparatus, a television, a video camera, a video recorder, a car navigation device, a real-time clock device, a pager, an electronic notebook, an electronic dictionary, a calculator, an electronic game apparatus, a game controller, a word processor, a workstation, a videophone, a crime prevention television monitor, electronic binoculars, a POS terminal, a medical apparatus such as an electronic clinical thermometer, a sphygmomanometer, a blood glucose meter, an electrocardiogram measurement device, an ultrasonic diagnostic device, or an electronic endoscope, a fish finder, various measurement apparatuses, meters of a vehicle, an aircraft, a ship, or the like, a flight simulator, a head mounted display, a motion trace, a motion tracking, a motion controller, and a pedestrian self-navigating device.

Figure 14:
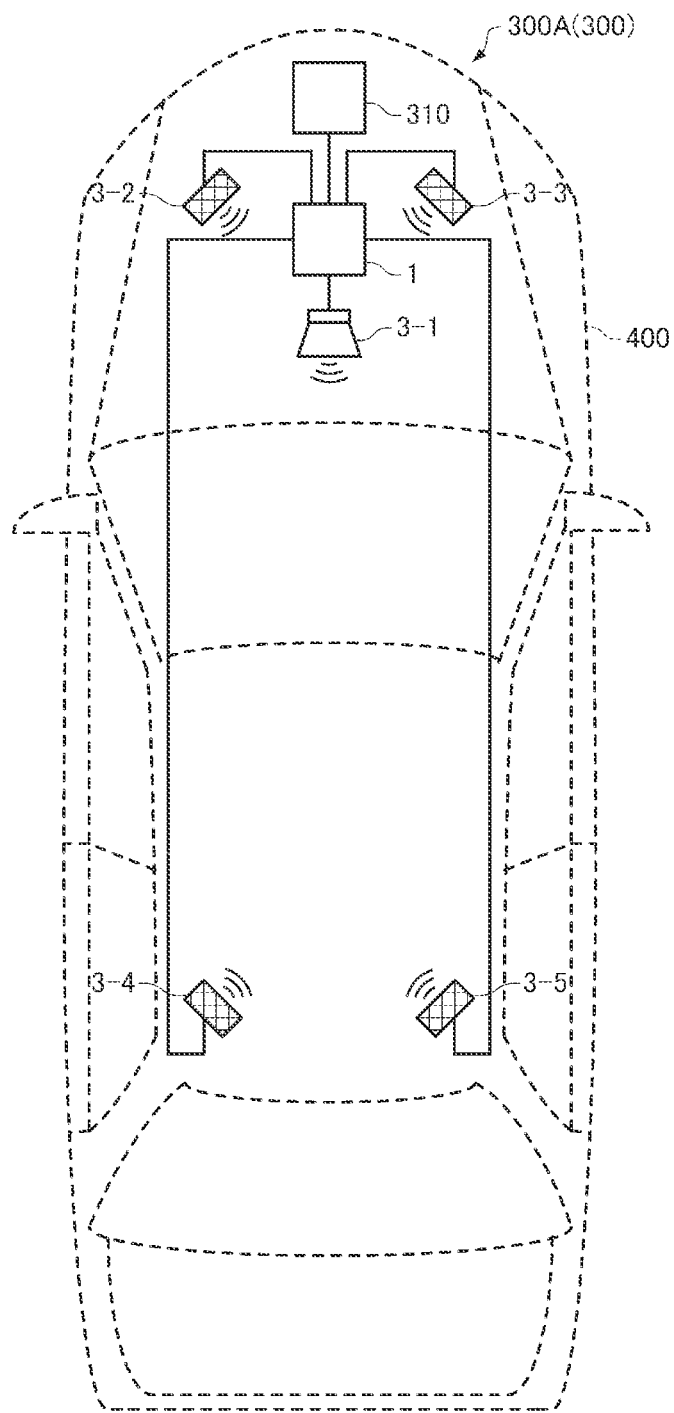
FIG. 14 is a diagram showing a configuration example of a warning device that is an example of the electronic apparatus.

FIG. 14 is a diagram showing a configuration example of a warning device 300A that is an example of the electronic apparatus 300. In FIG. 14, constituent elements the same as those in FIG. 13 are denoted by the same reference numerals. The warning device 300A shown in FIG. 14 is mounted on a vehicle 400. The sound reproduction device 3-1 is a speaker, and the sound reproduction devices 3-2 to 3-5 are buzzers.

The processing unit 310 transmits reproduction commands or the like of various sounds to the semiconductor device 1 based on signals from various sensors (not shown). Examples of the various sounds include: a sound or a warning sound imitating a voice of a person for notifying an abnormality of a brake, engine oil, power steering, a brake override system, or the like, traveling with an ajar door, unsteady traveling, traveling without releasing a parking brake, not wearing a seatbelt, approaching a preceding vehicle, and the like, a sound effect for notifying a blinker, a hazard, backing, and the like.

Based on a command from the processing unit 310, the semiconductor device 1 generates a sound signal based on some of a plurality of pieces of sound source data corresponding to the various sounds, and outputs the generated sound signal to the sound reproduction device 3-1. Further, the semiconductor device 1 may inspect the sound source reproduction circuit 100 described above and transmit an inspection result to the processing unit 310, and the processing unit 310 may determine presence or absence of a failure in the sound source reproduction circuit 100. Alternatively, when the failure in the sound source reproduction circuit 100 is detected, the semiconductor device 1 may switch an output destination of the sound signal from the sound reproduction device 3-1 to the sound reproduction device 3-2.

Since the semiconductor device 1 can generate the signal required for accurately detecting a failure in the sound source reproduction circuit 100, it is possible to implement the highly reliable warning device 300A.

The present disclosure is not limited to the embodiment, and various modifications can be made within a scope of gist of the present disclosure.

The embodiments and the modifications described above are examples, and are not limited thereto. For example, the embodiments and the modifications can be combined as appropriate.

The present disclosure includes a configuration substantially the same as the configurations described in the embodiments, for example, a configuration having the same function, method, and result, or a configuration having the same object and effects. Further, the present disclosure includes a configuration obtained by replacing a non-essential part of the configurations described in the embodiments. Further, the present disclosure includes a configuration that achieves operations and effects the same as those of the configurations described in the embodiments, or a configuration that can achieve the same object. Further, the present disclosure includes a configuration obtained by adding a well-known technique to the configurations described in the embodiments.

The following content is derived from the embodiments and the modifications described above.

A semiconductor device according to an aspect includes:
 a pulse-width modulation circuit configured to pulse-width modulate a signal based on a first pulse-code modulated signal that is a sound source signal, and output a first pulse-width modulated signal;

a first conversion circuit configured to convert a second pulse-width modulated signal based on the first pulse-width modulated signal into a second pulse-code modulated signal; and a comparison circuit configured to convert the first pulse-code modulated signal into a first comparison target signal by an inversely convertible conversion method, convert the second pulse-code modulated signal into a second comparison target signal by the conversion method, and compare the first comparison target signal with the second comparison target signal.

In the semiconductor device, since the comparison circuit converts the first pulse-code modulated signal that is the sound source signal into the first comparison target signal by the inversely convertible conversion method, the sound source signal can be restored from the first comparison target signal. Further, since the comparison circuit converts the second pulse-code modulated signal based on the first pulse-width modulated signal obtained by pulse-width modulating the sound source signal into the second comparison target signal by the inversely convertible conversion method, the second pulse-code modulated signal can be restored from the second comparison target signal. That is, no information is lost when the sound source signal and the second pulse-code modulated signal are respectively converted into the first comparison target signal and the second comparison target signal. Therefore, the comparison circuit can accurately generate a signal indicating correlation between the sound source signal and the second pulse-code modulated signal by comparing the first comparison target signal with the second comparison target signal. Therefore, for example, the external device can accurately detect a failure in the sound source reproduction circuit including the pulse-width modulation circuit based on the signal output from the comparison circuit.

The semiconductor device according to the aspect may further include:

a failure detection circuit configured to detect a failure in a sound source reproduction circuit including the pulse-width modulation circuit based on a comparison result of the comparison circuit.

According to the semiconductor device, the failure detection circuit can accurately detect a failure in the sound source reproduction circuit based on a highly accurate signal output from the comparison circuit.

The semiconductor device according to the aspect may further include:

an amplifier circuit configured to output an amplified signal obtained by amplifying the first pulse-width modulated signal to a first sound reproduction device, in which when the failure in the sound source reproduction circuit is detected, the failure detection circuit may cause a second sound reproduction device different from the first sound reproduction device to output the signal based on the first pulse-code modulated signal.

According to the semiconductor device, when the sound source reproduction circuit fails, the second sound reproduction device can generate a normal sound, and the first sound reproduction device cannot generate an abnormal sound.

In the semiconductor device according to the aspect, the conversion method may be wavelet packet analysis.

According to the semiconductor device, since the comparison circuit generates the signal indicating the correlation between the sound source signal and the second pulse-code modulated signal using the wavelet packet analysis having characteristics of dispersing an error, for example, the external device is less likely to erroneously determine that the sound source reproduction circuit including the pulse-width modulation circuit fails when the sound source reproduction circuit is normal based on the signal output from the comparison circuit.

In the semiconductor device according to the aspect,
the first conversion circuit may integrate the second pulse-width modulated signals in a predetermined cycle to generate the second pulse-code modulated signal.

According to the semiconductor device, the second pulse-width modulated signal can be converted into the second pulse-code modulated signal without losing information.

The semiconductor device according to the aspect may further include:

an amplifier circuit configured to output an amplified signal obtained by amplifying the first pulse-width modulated signal; and a second conversion circuit configured to convert the amplified signal into the second pulse-width modulated signal.

According to the semiconductor device, for example, the external device can accurately detect a failure in the sound source reproduction circuit including the pulse-width modulation circuit and the amplifier circuit based on the signal output from the comparison circuit.

In the semiconductor device according to the aspect,
the second pulse-width modulated signal may be the first pulse-width modulated signal.

An electronic apparatus according to an aspect includes:
the semiconductor device according to the aspect; and
a sound reproduction device, in which
the semiconductor device includes an amplifier circuit configured to output an amplified signal obtained by amplifying the first pulse-width modulated signal to the sound reproduction device.

According to the electronic apparatus, since the semiconductor device that can generate the signal required for accurately detecting a failure in the sound source reproduction circuit is provided, reliability can be improved.

What is claimed is:

1. A semiconductor device comprising:
   a pulse-width modulation circuit configured to pulse-width modulate a signal based on a first pulse-code modulated signal that is a sound source signal, and output a first pulse-width modulated signal;
   a first conversion circuit configured to convert a second pulse-width modulated signal based on the first pulse-width modulated signal into a second pulse-code modulated signal; and
   a comparison circuit configured to:
      perform a wavelet packet analysis on the first pulse-code modulated signal to convert the first pulse-code modulated signal into a first comparison target signal by an inversely convertible conversion method;
      perform the wavelet packet analysis on the second pulse-code modulated signal to convert the second pulse-code modulated signal into a second comparison target signal by the conversion method; and
      compare the first comparison target signal with the second comparison target signal to calculate a correlation value therebetween.

2. The semiconductor device according to claim 1, further comprising:

a failure detection circuit configured to detect a failure in a sound source reproduction circuit including the pulse-width modulation circuit based on a comparison result of the comparison circuit.

3. The semiconductor device according to claim 2, further comprising:
an amplifier circuit configured to output an amplified signal obtained by amplifying the first pulse-width modulated signal to a first sound reproduction device, wherein
when the failure in the sound source reproduction circuit is detected, the failure detection circuit causes a second sound reproduction device different from the first sound reproduction device to output the signal based on the first pulse-code modulated signal.

4. The semiconductor device according to claim 1, wherein
the first conversion circuit integrates the second pulse-width modulated signals in a predetermined cycle to generate the second pulse-code modulated signal.

5. The semiconductor device according to claim 1, further comprising:
an amplifier circuit configured to output an amplified signal obtained by amplifying the first pulse-width modulated signal; and
a second conversion circuit configured to convert the amplified signal into the second pulse-width modulated signal.

6. The semiconductor device according to claim 1, wherein
the second pulse-width modulated signal is the first pulse-width modulated signal.

7. An electronic apparatus comprising:
the semiconductor device according to claim 1; and
a sound reproduction device, wherein
the semiconductor device includes an amplifier circuit configured to output an amplified signal obtained by amplifying the first pulse-width modulated signal to the sound reproduction device.

* * * * *